United States Patent
Lee et al.

(10) Patent No.: US 6,426,902 B1
(45) Date of Patent: Jul. 30, 2002

(54) SEMICONDUCTOR MEMORY DEVICE HAVING REDUNDANCY CIRCUIT CAPABLE OF IMPROVING REDUNDANCY EFFICIENCY

(75) Inventors: Hi-choon Lee, Sungnam; Seung-hoon Lee, Yongin; Hyung-dong Kim, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/657,318

(22) Filed: Sep. 7, 2000

(30) Foreign Application Priority Data

Sep. 7, 1999 (KR) .............................. 99-37907
May 24, 2000 (KR) ........................ 2000-28029

(51) Int. Cl.[7] .................................. G11C 7/00
(52) U.S. Cl. ................... 365/200; 365/230.03
(58) Field of Search ............... 365/200, 230.03, 365/189.01, 230.01

(56) References Cited

U.S. PATENT DOCUMENTS

| | | | | |
|---|---|---|---|---|
| 4,807,191 A | * | 2/1989 | Flannagan | 714/711 |
| 5,404,331 A | * | 4/1995 | McClure | 365/200 |
| 5,610,865 A | * | 3/1997 | Shin et al. | 365/200 |
| 5,848,003 A | * | 12/1998 | Nishikawa | 365/200 |
| 5,930,194 A | * | 7/1999 | Yamagata et al. | 365/230.03 |

* cited by examiner

*Primary Examiner*—Hoai V. Ho
(74) *Attorney, Agent, or Firm*—Marger Johnson & McCollom, P.C.

(57) ABSTRACT

A redundancy circuit is used to repair a normal column containing a defective normal memory cell. The redundancy circuit comprises a redundancy column containing redundancy memory cells and a plurality of programmable decoders. When any one of the plurality of programmable decoders enters a repair mode, a column pre-decoder for selecting a column containing a normal memory cell is disabled. Each of the programmable decoders can be configured to replace a column containing a defective normal memory cell in a single memory bank or a single memory bank group with a redundancy column. Since a defective column is replaced with a redundancy column in individual banks or bank groups, redundancy efficiency is greatly improved by allowing multiple normal columns containing defective cells to be replaced using a single redundancy column.

20 Claims, 8 Drawing Sheets

SEMICONDUCTOR MEMORY DEVICE HAVING REDUNDANCY CIRCUIT CAPABLE OF IMPROVING REDUNDANCY EFFICIENCY

BACKGROUND OF THE INVENTION

1. Field of the Invention

The present invention relates to semiconductor memory devices, and more particularly, to a semiconductor memory devices having a redundancy circuit capable of improving redundancy efficiency.

2. Description of the Related Art

Dynamic random access memories (DRAMs) include a large number of memory cells. Unfortunately, if even one of those memory cells fails to operate properly, the entire DRAM is treated as defective. As the integration density and the processing rate of semiconductor memory devices increase, the probability that a DRAM will have at least one defective cell increases.

The yield of a wafer determines the manufacturing cost of DRAMs. The yield is represented by the ratio of the number of non-defective chips to the total number of chips manufactured on a single wafer. As the defect rate increases, the yield decreases. The ability to correct defective cells is therefore very important to improving the yield of a wafer for high integration density memory devices.

Redundancy circuits are frequently used on a chip to replace defective cells with redundant cells. A redundancy circuit corrects defective cells and improves yield. Generally, the redundancy circuit drives a redundancy memory cell block, containing a matrix of redundant rows and columns. The redundancy circuit selects a redundancy cell from the redundancy cell block to replace a defective cell of a normal memory cell block. In other words, once a row and/or column address signal addressing a defective cell is input into the redundancy circuit, the redundancy circuit selects a redundancy memory cell to replace the defective cell.

A method for replacing a defective row and/or column occurring in a normal memory cell block with a redundancy row and/or column is disclosed in U.S. Pat. No. 5,325,334. According to that patent, once a column address signal containing a defective column is input into a fuse box array, a predetermined redundancy column is activated, and the activated redundancy column replaces the entire defective column. In the fuse box array, a plurality of fuse boxes are arranged to facilitate repair of a plurality of defective columns. Each fuse box includes a plurality of fuses and is programmed by cutting/blowing one or more of the fuses to correspond to a column address signal of a defective column. Accordingly, once programmed, when a column address of a defective column is received by the programmed fuse box, a redundancy column driver gate is activated in response to the output signal of a block selection control circuit and selects the predetermined redundancy column.

A redundancy scheme according to the above U.S. Patent is illustrated schematically in FIG. 1. As shown in FIG. 1, a normal memory cell block includes a plurality of banks BANK0–15. The normal memory cell block shown also includes four defective cells DEFECT_1–4. Each of the four defective cells DEFECT_1–4 occurring in the normal memory cell block appears as an "x". Redundancy cell blocks are provided at both ends of the normal memory cell block. Although each redundancy cell block may be designed to replace a plurality of defective cells, each redundancy cell block in this example is designed to replace a single defective cell.

A first defective cell DEFECT_1 is replaced using a left redundancy cell block by programming a first fuse box FB1 with the column address of that cell. The second, third, and fourth defective cells DEFECT_2, DEFECT_3, and DEFECT_4, respectively, are all caused by a defect in a bit. Each of these defective cells is replaced using a right redundancy cell block by programming a second fuse box FB2 with the a column address of the defective bit. Using this arrangement, a column connected to a defective cell within the normal memory cell block is replaced entirely by a redundancy column. In other words, a column selection path for selecting a column containing a defective cell is blocked and redirected to a redundancy column. In this way, not only the defective cell, but also all of the normal cells within the same column, are replaced by redundancy cells in the redundancy column.

Unfortunately, however, in some cases, a redundancy column used to replace a normal column with a defective cell may also contain a defective cell. For instance, in the example shown in FIG. 1, even though the defective normal cell DEFECT_1 is replaced by a non-defective redundancy cell in the redundancy column, another cell in the redundancy column is defective. Accordingly, the redundancy column cannot be used and the entire memory device is defective. The desired redundancy efficiency therefore cannot be obtained where there is a defect in the redundancy column.

Another way to improve redundancy efficiency is to increase the number of redundancy cells. Unfortunately, although increasing the number of redundancy cells increases redundancy efficiency, it also increases chip size because each additional redundancy cell takes up chip space. A redundancy circuit capable of improving redundancy efficiency with substantially invcreasing chip size is desired.

SUMMARY OF THE INVENTION

To increase the redundancy efficiency of a semiconductor memory device, a memory device according to a first embodiment of the invention includes a plurality of memory banks, wherein each of the memory banks includes a plurality of normal memory cells arranged in a matrix of rows and columns. A plurality of redundancy cells are also included, arranged in a redundancy column. The redundancy cells are used to repair normal columns containing defective normal memory cells, wherein columns in two or more memory banks are selected by a single column selection signal.

The semiconductor memory device also includes a redundancy circuit for controlling replacement of the columns containing the defective normal memory cells with the redundancy column. The redundancy circuit includes programmable decoders comprising column fuses and a plurality of bank fuses. Each of the programmable decoders can be programmed with the address of a memory bank and a column to be repaired by selectively cutting a combination of column fuses and bank fuses corresponding to the column and the bank containing the defective normal memory cell. The redundancy circuit further includes a logic circuit for ORing the output signals of the plurality of programmable decoders to generate a redundancy selection signal that enables the redundancy column.

In another embodiment of the present invention, the redundancy circuit includes a selection logic unit instead of a logic circuit. The selection logic unit generates a redundancy selection signal in response to a predetermined control signal. The redundancy selection signal enables the redundancy column that corresponds to the output signals of the plurality of programmable decoders. In this manner, the selection logic unit determines whether to generate a redundancy selection signal that enables either a redundancy column located in an area in which the redundancy circuit is positioned or a redundancy column in another area.

Using a redundancy circuit according to the present invention, defective cells having different column addresses in different banks or bank groups can be replaced with a single redundancy column. The ability to replace multiple defective cells in different columns with a single redundancy column offers improved redundancy efficiency. In addition, enabling a redundancy circuit in another area to be used to replace defective cells further improves redundancy efficiency.

BRIEF DESCRIPTION OF THE DRAWINGS

The foregoing advantages of the present invention will become more readily apparent from the following detailed description of the preferred embodiments thereof, proceeding with reference to the attached drawings, in which.

DETAILED DESCRIPTION OF THE PREFERRED EMBODIMENTS

Figure 1:
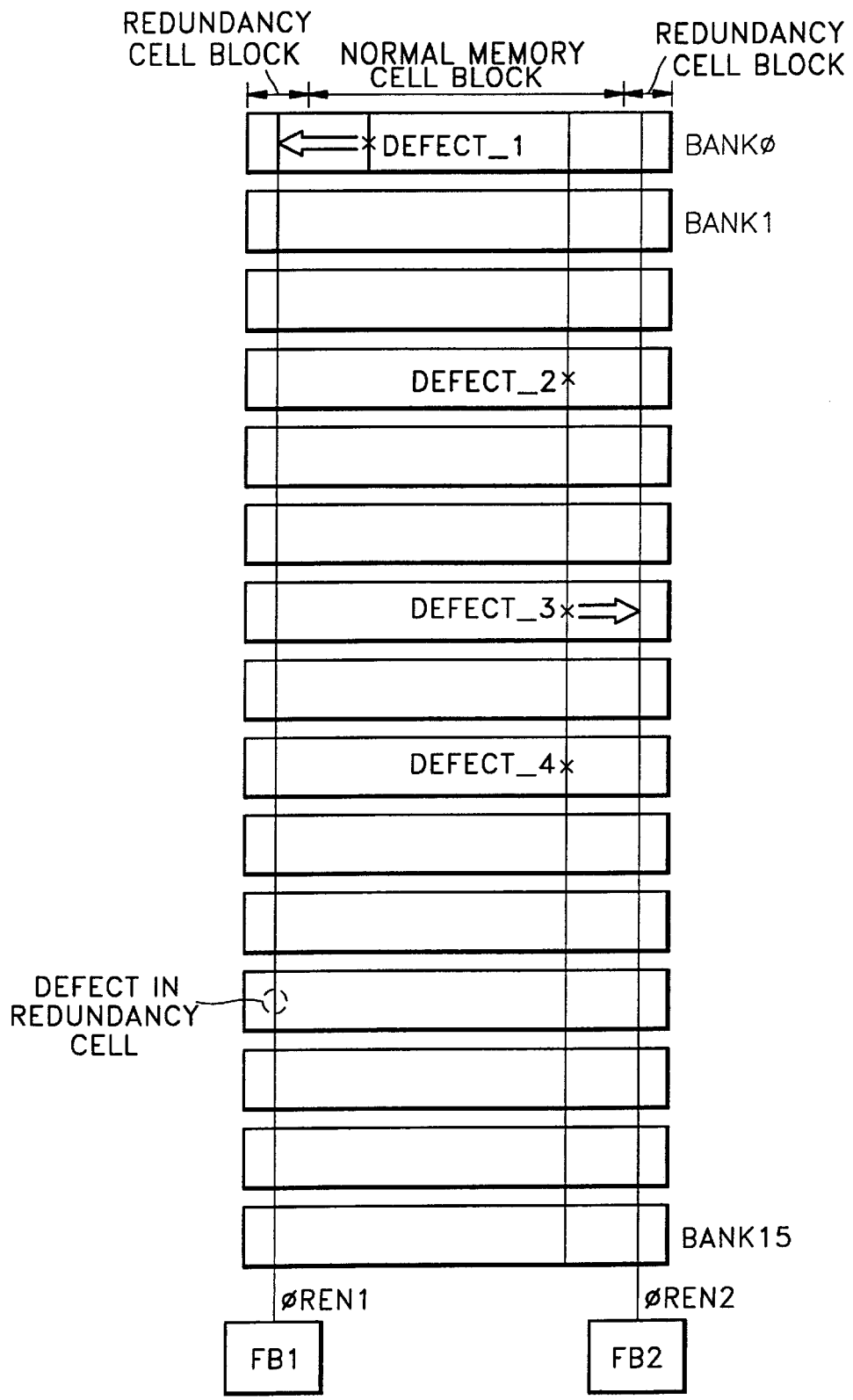
FIG. 1 is a schematic diagram illustrating a conventional redundancy scheme according to the prior art.
Figure 2:
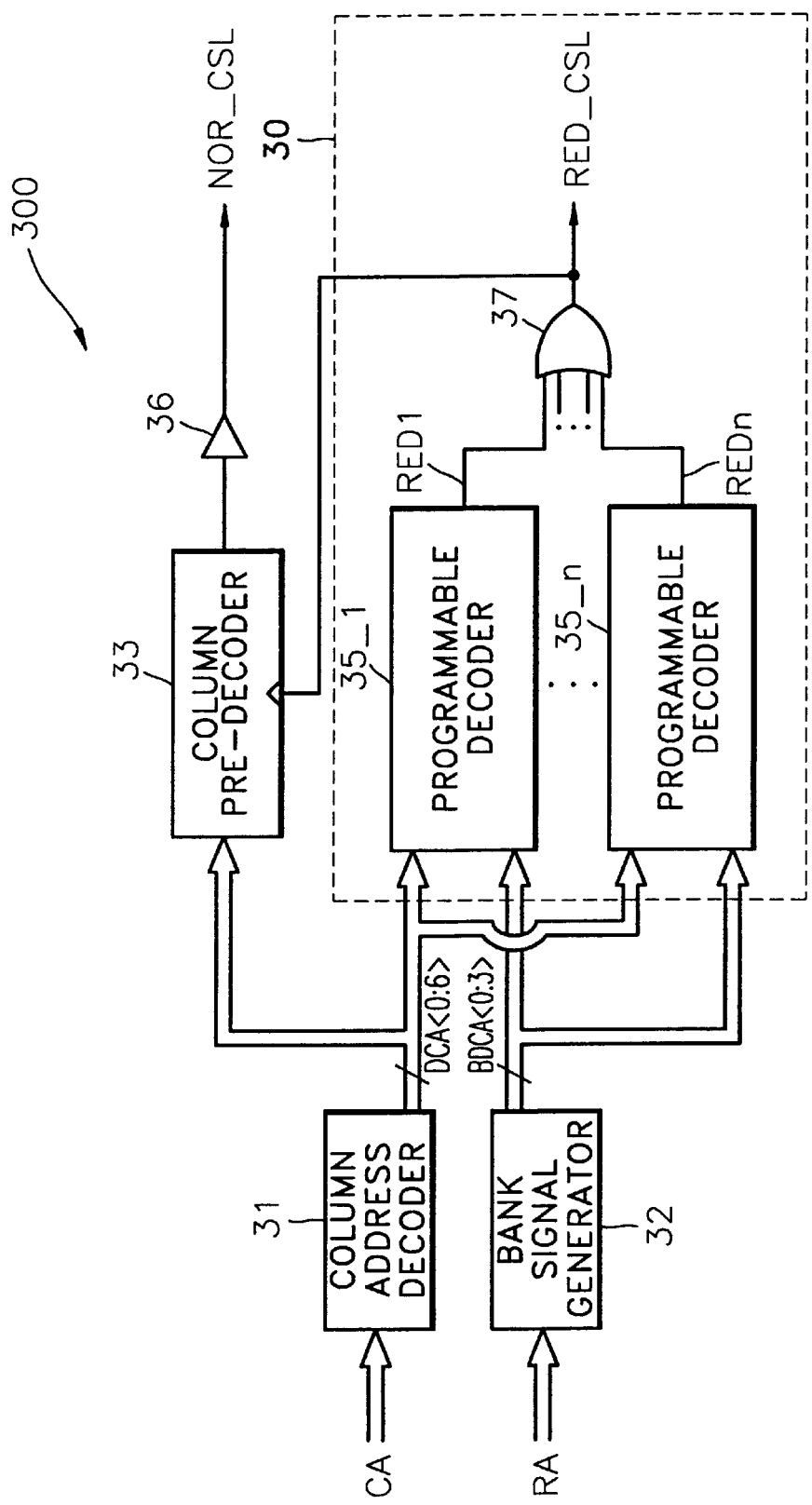
FIG. 2 is a block diagram of a memory device including a redundancy circuit according to a first embodiment of the present invention.

Various embodiments of the present invention will now be described in detail with reference to the attached drawings. Referring first to FIG. 2, a memory device 300 according to a first preferred embodiment includes a column address decoder 31, a bank signal generator 32, a column pre-decoder 33, a plurality of programmable decoders 35_i (where i=from 1 to n) and a logic circuit 37. The programmable decoders 35_i and the logic circuit 37 form a redundancy circuit 30.

In a normal operation mode, an externally input column address CA enables a normal selection signal NOR_CSL to select a column containing a normal memory cell through the column address decoder 31 and the column pre-decoder 33. The column address decoder 31 decodes the external column address group CA to provide an internal column address signal group DCA. The bank signal generator 32 decodes an external low address group RA to provide an internal bank signal group BDCA.

Figure 3:
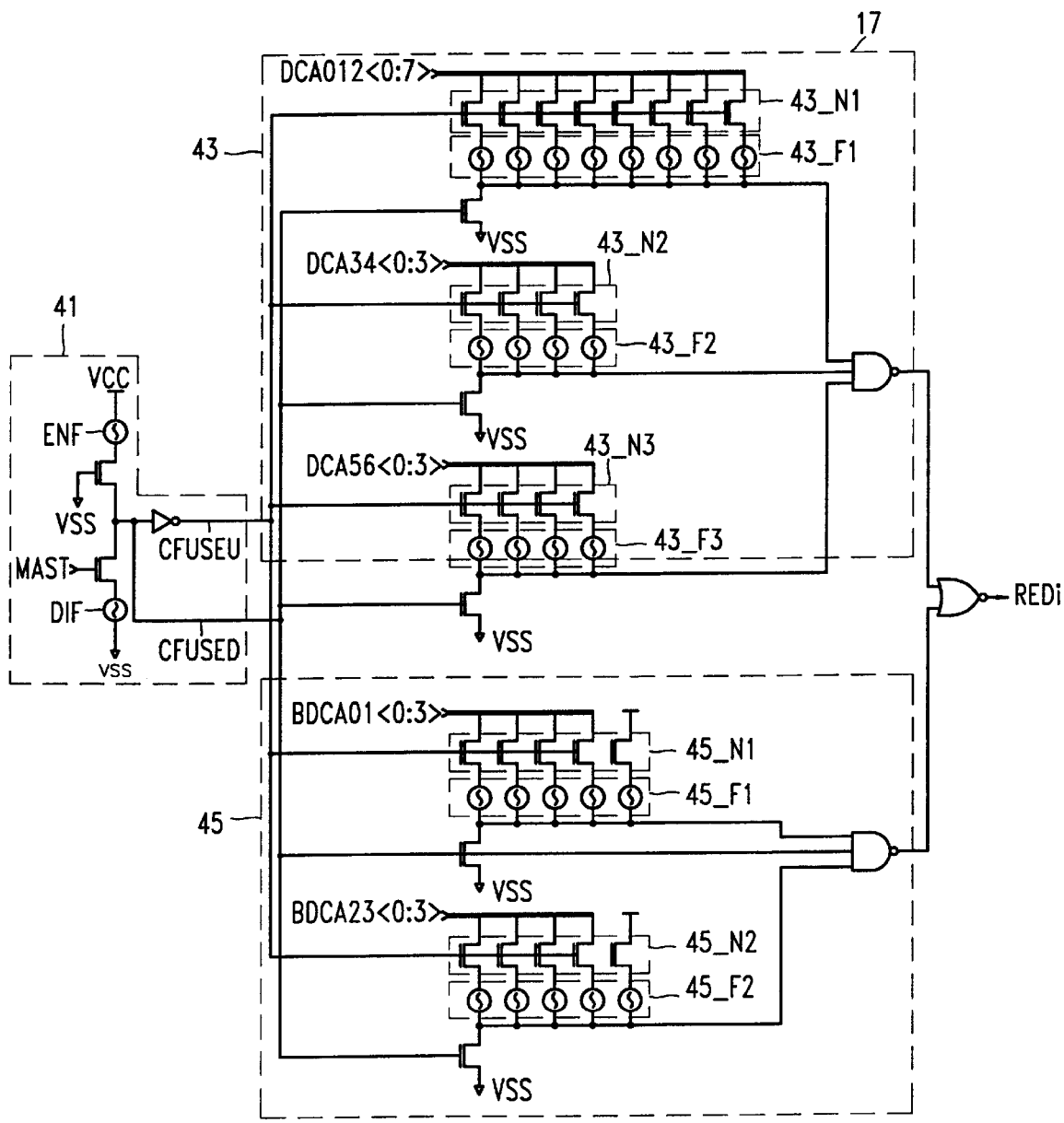
FIG. 3 is a detailed circuit diagram of a programmable decoder of the redundancy circuit of FIG. 2.

FIG. 3 is a detailed circuit diagram of a representative one of the programmable decoders 35_i of FIG. 2. Referring to FIGS. 2 and 3, each of the programmable decoders 35_i includes a plurality of column fuses 43_F1–3 and a plurality of bank fuses 45_F1–2, which can be cut to program the decoder. The combination of the column fuses 43_F1–3 and the bank fuses 45_F1–2 indicates a memory bank and a column of the bank which are to be replaced. Each of the programmable decoders 35_i activates a corresponding output signal REDi in response to a predetermined column address signal group DCA and a predetermined bank signal group BDCA.

The logic circuit 37 ORs the output signals REDi of the programmable decoders 35_i to generate a redundancy selection signal RED_CSL. Accordingly, when any one of the output signals REDi of the programmable decoders 35_i is activated to a logic "high" level, the redundancy selection signal RED_CSL is activated to a logic "high" level. In the logic "high" level, the redundancy selection signal RED_CSL enables a redundancy column to replace a normal column containing a defective memory cell.

The column pre-decoder 33 activates a normal column selection signal NOR_CSL in response to the column address signal group DCA. A buffer 36 buffers the output signal of the column pre-decoder 33 to generate the normal column selection signal NOR_CSL. The normal column selection signal NOR_CSL selects a column containing a normal memory cell. The disabling of the column pre-decoder 33 is controlled by the redundancy selection signal RED_CSL. In other words, when the redundancy selection signal RED_CSL is activated to a logic "high" level, the column pre-decoder 33 is disabled.

The programmable decoder 35_i also includes a repair determiner 41, a repair column selector 43 and a repair bank selector 45. The repair determiner 41 generates first and second repair determining signals CFUSEU and CFUSED that control the enabling of the repair column selector 43 and the repair bank selector 45. Specifically, when a repair enable fuse ENF is cut, and a repair master signal MAST is a logic "high" level, the first repair determining signal CFUSEU becomes a logic "high" level, and the second repair determining signal CFUSED becomes a logic "low" level. Accordingly, the programmable decoder 35_i, in which the repair enable fuse ENF is cut, is enabled to both disable a normal column containing a defective memory cell and enable a redundancy column containing a redundancy cell. In this manner, a redundancy column can be selected to replace a normal column containing a defective memory cell.

On the other hand, when a repair disable fuse DIF is cut, the first repair determining signal CFUSEU becomes a logic "low" level, and the second repair determining signal CFUSED becomes a logic "high" level. Accordingly, the programmable decoder 35_i, in which the repair disable fuse DIF is cut, does not repair a defective normal memory cell.

In the repair column selector 43, an address for a column containing a normal memory cell to be replaced is programmed by selectively cutting the column fuses 43_F1–3. Specifically, to program the repair column selector 43 with a column address of a column to be repaired, the column fuses 43_F1–3 connected to column addresses other than the desired column address are cut. Accordingly, when the repair enable fuse ENF is cut and the first repair determining signal CFUSEU becomes a logic "high" level, the selected series of NMOS transistors 43_N1–3 are enabled, thereby forming a column address path. Similarly, the repair bank selector 45 is programmed corresponding to a memory bank to be repaired by selectively cutting bank fuses 45_F1–2.

Figure 4:
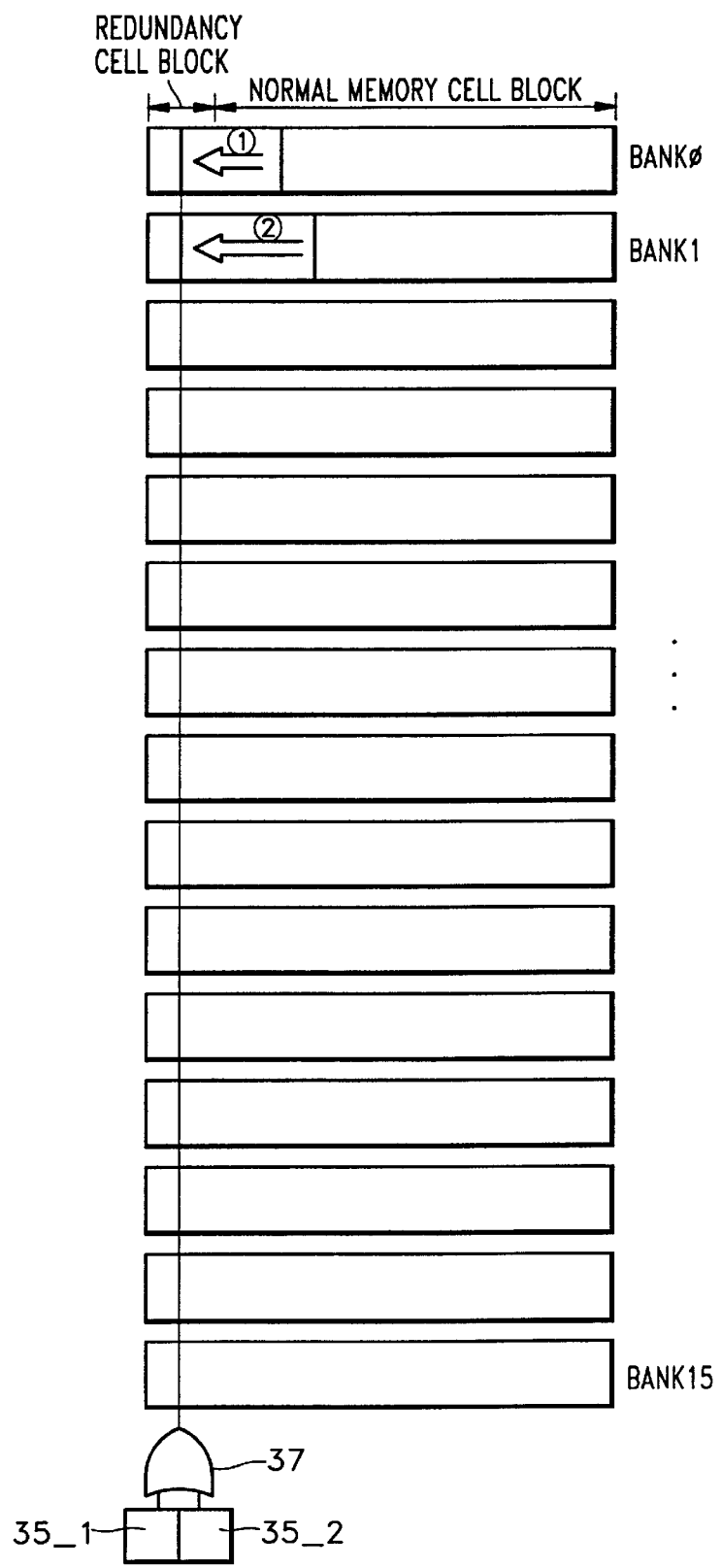
FIG. 4 is a schematic diagram illustrating a method of repairing a defective normal memory cell in individual memory banks according to one aspect of this invention.

In a redundancy circuit according to the present invention, a repair operation for replacing a normal column containing a defective cell with a redundancy column can be independently performed with respect to individual memory banks or bank groups. FIG. 4 is a schematic diagram illustrating repair of a defective normal memory cell using independent memory banks. Referring to FIGS. 3 and 4, when a normal memory cell in a first bank BANK0 is defective, all of the bank fuses not connected to a bank signal group BDCA corresponding to the first bank BANK0 are cut. Accordingly, when a column address is input into the column fuses which are not cut, a column containing the defective normal memory cell is disabled, and a redundancy column is enabled. Therefore, only the portion of the defective column corresponding the first bank BANK0 is replaced with the redundancy column.

When the second bank BANK1 also has a defective normal memory cell, a separate programmable decoder 35_2 is used to repair the defective column in the second bank BANK1. The same programming method that was used for repairing the column of the first bank BANK0 can therefore also be used for repairing a column containing the defective normal memory cell in the second bank BANK1. By using separate programmable decoders, multiple columns, each containing a defective memory cell in a different bank unit, can be replaced using a single redundancy column.

Figure 5:
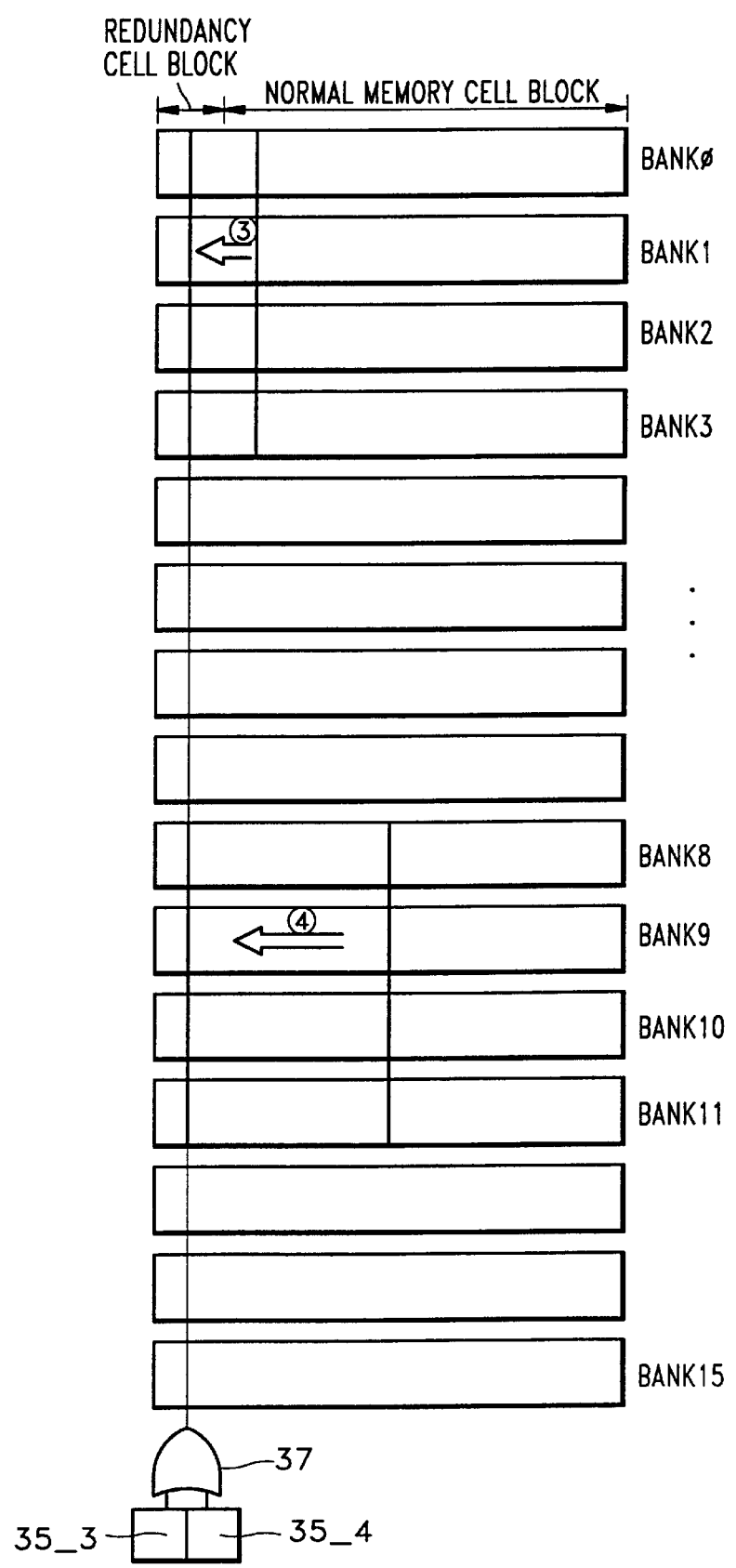
FIG. 5 is a schematic diagram illustrating a method of repairing defective normal memory cells of a plurality of memory banks by constructing memory bank groups according to another aspect of this invention.

In a redundancy circuit according to another aspect of the present invention, a plurality of memory banks arranged into a memory bank group may be programmed for repair using a single programmable decoder. FIG. 5 is a schematic diagram illustrating a method of repairing defective normal memory cells of a plurality of memory banks by constructing memory bank groups. Referring to FIGS. 3 and 5, defective normal memory cells in the first bank BANK0 through the fourth bank BANK3 are contained in the same column. To repair those defective cells, all of the bank fuses in a programmable decoder $35_1 3$, except for those corresponding to the first bank BANK0 through the fourth bank BANK3, are cut. The defective normal memory cells in that column in the first bank BANK0 through the fourth bank BANK3 are thereby replaced with redundancy cells in a redundancy column.

Similar to the method described with reference to FIG. 4, the method illustrated by FIG. 5 can also be used to replace defective cells in different normal columns using a single redundancy column. Specifically, a separate programmable decoder 35_4 can be used to repair defective normal memory cells in a second bank group BANK8–11, using the same redundancy column that was used to repair the defective column in the first bank group BANK0–3. In this manner, a single redundancy column can be used to replace different defective columns in different memory bank groups.

Figure 6:
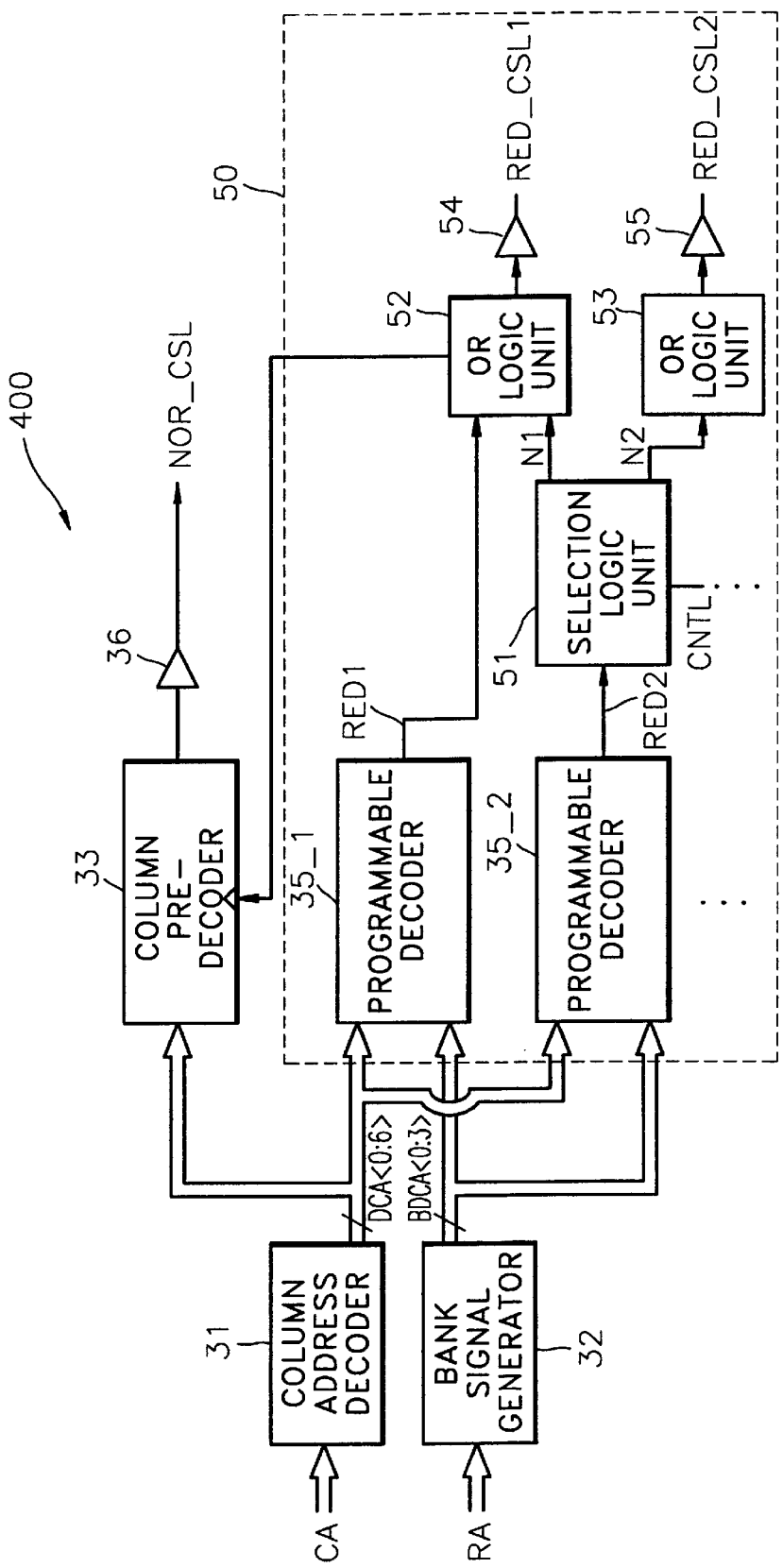
FIG. 6 is a block diagram of a memory device including a redundancy circuit having a selection logic unit according to another embodiment of the present invention.

FIG. 6 is a schematic block diagram of a memory device 400 including a redundancy circuit 50 according to another embodiment of the present invention. Referring to FIG. 6, the redundancy circuit 50 is different from the redundancy circuit 30 of FIG. 2 in that a selection logic unit 51, OR logic units 52, 53, and buffers 54, 55 are used in the place of the logic circuit 37 of FIG. 2. In the embodiment shown in FIG. 6, the second programmable decoder 35_2 is connected to the selection logic unit 51. In operation, the selection logic unit 51, for example, determines whether to transmit the output RED2 of a second programmable decoder 35_2 to the first OR logic unit 52 or to the second OR logic unit 53, in response to a control signal CNTL.

Figure 7:
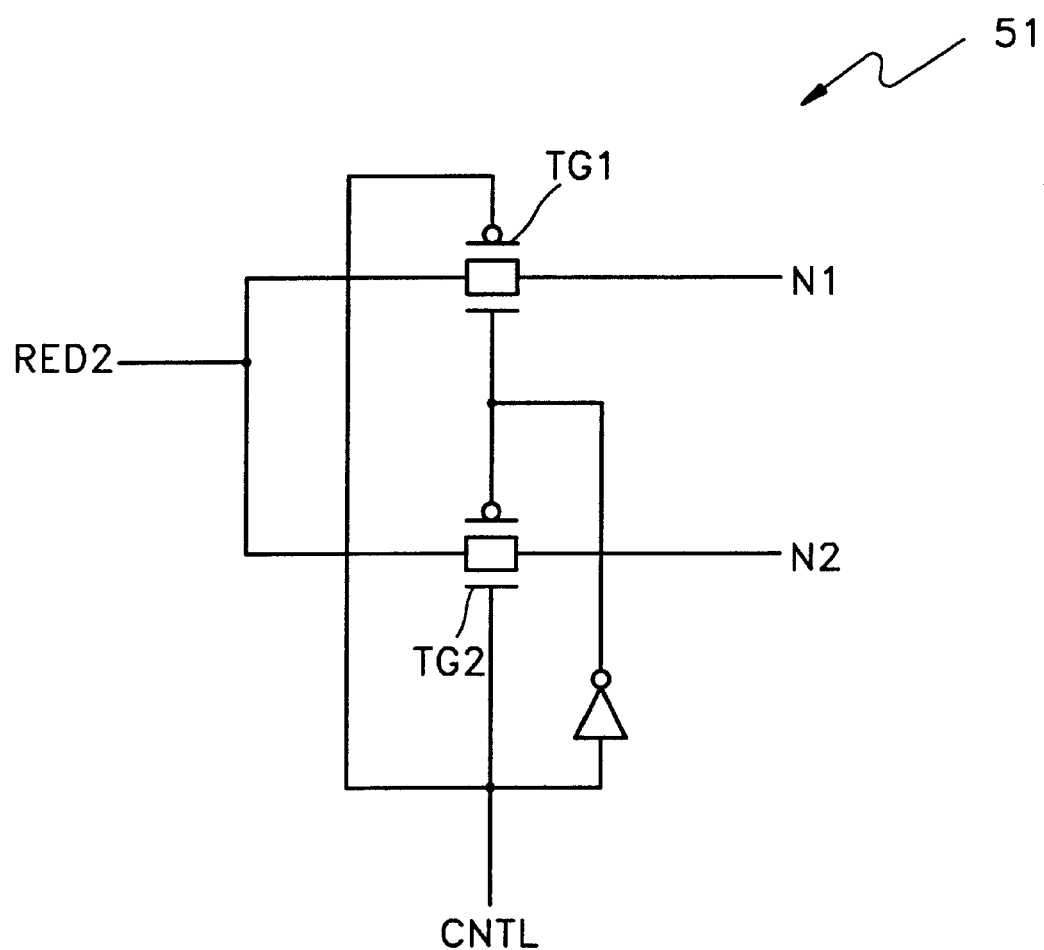
FIG. 7 is a detailed circuit diagram of the selection logic unit of FIG. 6.

FIG. 7 is a detailed circuit diagram of the selection logic unit 51 of the redundancy circuit 50 shown in FIG. 6. Referring to FIGS. 6 and 7, a first transmission gate TG1 is turned on in response to a logic "low" level of the control signal CNTL and transmits the output RED2 of the programmable decoder 35_2 to a first node N1 connected to the first OR logic unit 52. In response to a logic "high" level of the control signal CNTL, a second transmission gate TG2 is turned on and transmits the output RED2 of the programmable decoder 35_2 to a second node N2 connected to the second OR logic unit 53.

The first OR logic unit 52 activates a single redundancy column RED_CSL1 in response to the output RED1 of the first programmable decoder 35_1 and the output RED2 of the second programmable decoder 35_2. The fuse programming in the first programmable decoder 35_1 is different from the fuse programming in the second programmable decoder 35_2. Accordingly, a single redundancy column RED_CSL1 can be used to replace different defective columns in different banks.

Figure 8:
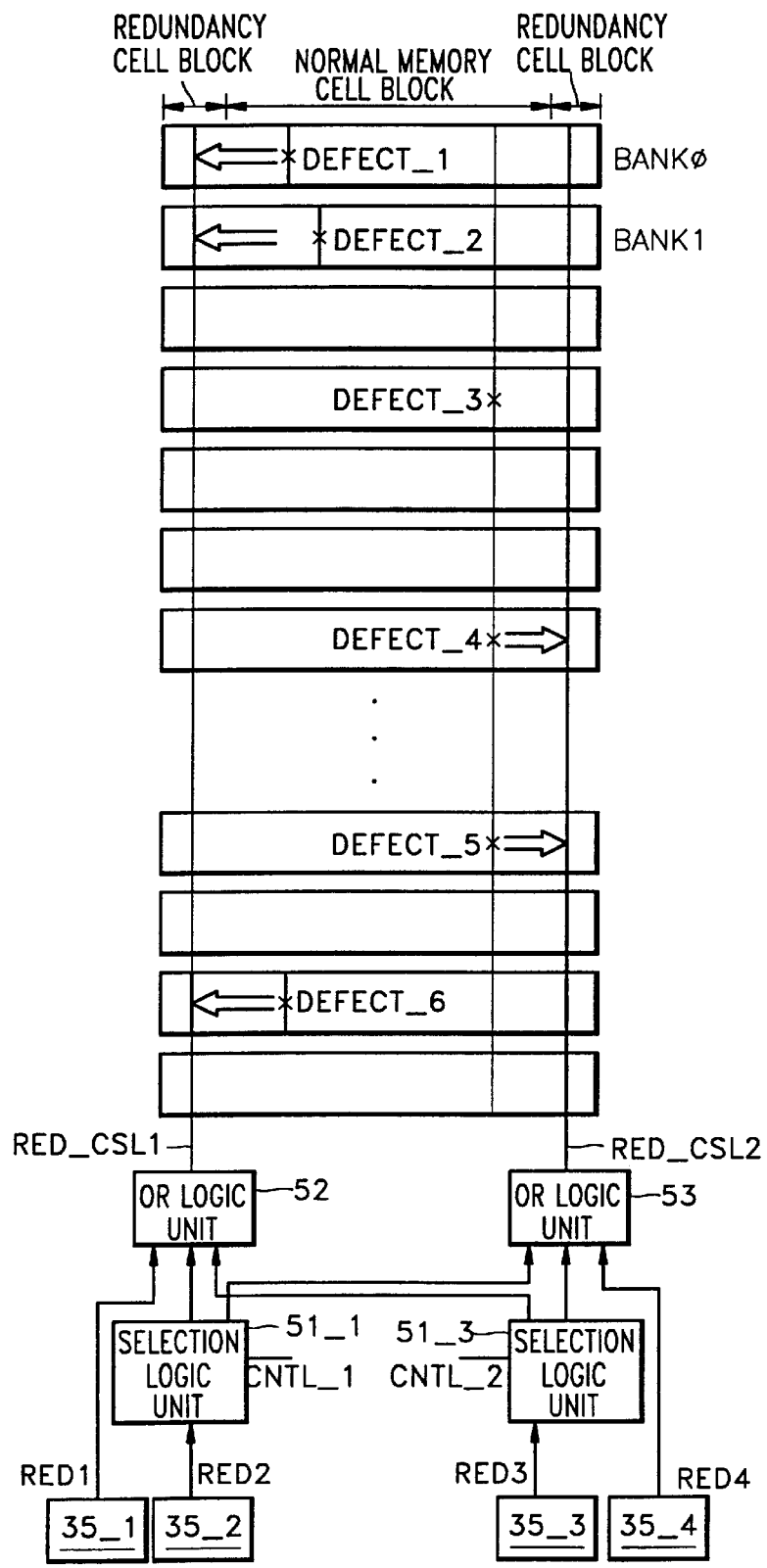
FIG. 8 is a schematic diagram illustrating a redundancy scheme implemented using the redundancy circuit of FIG. 6.

FIG. 8 is a diagram showing a redundancy scheme implemented by the redundancy circuit 50 of FIG. 6. Referring to FIGS. 6 and 8, first and second programmable decoders 35_1, 35_2, respectively, are positioned below a redundancy cell block on the left of a normal memory cell block, and third and fourth programmable decoders 35_3, 35_4, respectively, are positioned below a redundancy cell block on the right of the normal memory cell block. Generally, each of the programmable decoders replaces a defective cell in a normal memory cell block with a redundancy cell block located at a position corresponding to the defective cell. In other words, columns connected to first and second defective cells DEFECT_1, DEFECT_2, respectively, in the normal memory cell block are replaced with a first redundancy column RED_CSL1 by the first and second programmable decoders 35_1, 35_2, respectively. A column connected to third, fourth, and fifth defective cells DEFECT_3–5, occurring due to a defective bit in the normal memory cell block, is replaced with a second redundancy column RED_CSL2 by the fourth programmable decoder 35_4.

Assuming that all of the redundancy cells in the right redundancy cell blocks have been used to replace other defective cells, a sixth defective cell DEFECT_6 is replaced by a redundancy cell in the first redundancy column RED_CSL1 using the third programmable decoder 35_3. In this case, the control signal CNTL_1 of a first selection logic unit 51_1 is a logic "low" level, and the output RED2 of the second programmable decoder 35_2 is not transmitted to a second OR logic unit 53. This is because the right redundancy cells are all used for replacing defective cells, and thus no redundancy cells exist for replacement. The control signal CNTL_2 of a second selection logic unit 51_2 is logic "high" level, and the output RED3 of the third programmable decoder 35_3 is transmitted to a first OR logic unit 52. Accordingly, the first OR logic unit 52 activates a single redundancy column RED_CSL1 in response to the outputs RED1, RED2, and RED3 of the respective first, second, and third programmable decoders 35_1, 35_2, and 35_3. In this manner, a memory device having a redundancy circuit according to this embodiment can replace defective cells with redundancy circuits in different areas, thereby further improving redundancy efficiency.

Although the invention has been described with reference to various preferred embodiments, it will be apparent to one of ordinary skill in the art that modification of the described embodiments may be made without departing from the spirit and scope of the invention. Therefore, the scope of the invention, as defined by the following claims, should not be limited to the preferred embodiments described herein.

What is claimed is:

1. A semiconductor memory device comprising:
   a plurality of memory banks, wherein each of the memory banks comprises a plurality of normal memory cells arranged in a plurality of normal columns;
   a plurality of redundancy cells arranged in a redundancy column, wherein said redundancy column is used to replace one or more defective normal columns, each containing one or more defective normal memory cells, and wherein columns in two or more memory banks are selected by a single column selection signal;
   a redundancy circuit for controlling replacement of the one or more defective normal columns with the redundancy column, wherein the redundancy circuit comprises a plurality of programmable decoders capable of being programmed corresponding to both a normal column and a memory bank containing a defective memory cell, each programmable decoder further capable of generating an output signal in response to a predetermined column address signal group and a predetermined bank signal group, and a logic unit for generating a redundancy selection signal enabling the redundancy column based on the output signals of the programmable decoders; and
   a column predecoder that is enabled under the control of the redundancy selection signal and that activates the column selection signal in response to the column address signal group.

2. The semiconductor memory device of claim 1, further comprising a selection logic unit for selectively enabling repair of a defective cell in one area with a redundancy cell in a different area.

3. A semiconductor memory device comprising:
   a plurality of memory banks, wherein each of the memory banks comprises a plurality of normal memory cells arranged in a plurality of normal columns;
   a plurality of redundancy cells arranged in a redundancy column, wherein said redundancy column is used to replace one or more defective normal columns, each containing one or more defective normal memory cells, and wherein columns in two or more memory banks are selected by a single column selection signal; and
   a redundancy circuit for controlling replacement of the one or more defective normal columns with the redundancy column, wherein the redundancy circuit comprises a plurality of programmable decoders capable of being programmed corresponding to both a normal column and a memory bank containing a defective memory cell, each programmable decoder further capable of generating an output signal in response to a predetermined column address signal group and a predetermined bank signal group, and a logic unit for generating a redundancy selection signal enabling the redundancy column based on the output signals of the programmable decoders,
   wherein each of the programmable decoders comprises:
      a plurality of column fuses and bank fuses, said fuses being configured to be selectively cut or blown;
      a repair column selector configured to be programmed with an address of a column containing a defective memory cell to be repaired by selectively cutting or blowing one or more column fuses;
      a repair bank selector configured to be programmed with an address of a memory bank to be repaired by selectively cutting or blowing one or more bank fuses;
      a logic unit for ORing an output signal of the repair column selector and an output signal of the repair bank selector to generate the output signal of the programmable decoder; and
      a selection logic unit capable of selecting a redundancy column in a same area as the defective column or in a different area.

4. The semiconductor memory device of claim 2, wherein each of the programmable decoders further comprises a repair determiner having an enable fuse and a disable fuse for controlling enabling of the repair column selector and the repair bank selector.

5. A semiconductor memory device comprising:
   a plurality of memory banks, wherein each of the memory banks comprises a plurality of normal memory cells arranged in a plurality of normal columns;
   a plurality of redundancy cells arranged in a redundancy column, wherein said redundancy column is used to replace one or more defective normal columns, each containing one or more defective normal memory cells, and wherein columns in two or more memory banks are selected by a single column selection signal;
   a redundancy circuit for controlling replacement of the one or more defective normal columns with the redundancy column, wherein the redundancy circuit comprises a plurality of programmable decoders capable of being programmed corresponding to both a normal column and a memory bank containing a defective memory cell, each programmable decoder further capable of generating an output signal in response to a predetermined column address signal group and a predetermined bank signal group, and a logic unit for generating a redundancy selection signal enabling the redundancy column based on the output signals of the programmable decoders;
   a column address decoder for decoding an external column address group and generating the column address signal group; and
   a bank signal generator for decoding an external row address group and generating the bank signal group.

6. A method of repairing a semiconductor memory device comprising a plurality of memory banks, wherein each of the memory banks includes a plurality of normal memory cells arranged in a matrix of normal rows and normal columns, and a plurality of redundancy cells arranged in a redundancy column for repairing defective normal memory cells in the normal columns, said method comprising:
   selecting columns in two or more memory banks using a single column selection signal,
   independently controlling repair of the normal columns containing the defective normal memory cells with respect to memory banks containing the defective memory cells; and
   selecting a repair area to selectively repair the normal columns containing the defective normal memory cells with either a redundant column in a same area or a redundant column in a different area, as desired.

7. The method of claim 6, further comprising replacing defective normal memory cells in the memory banks in a normal columns using a redundancy column in a different area.

8. The method of claim 6, wherein independently controlling repair of the columns containing the defective normal memory cells with respect to memory banks containing the defective memory cells comprises controlling the repair with respect to memory bank groups, wherein each memory bank group comprises at least two memory banks.

9. The method of claim 8, further comprising using a redundancy column in a different area to replace defective normal memory cells in the memory bank groups of a plurality of normal columns.

10. A semiconductor memory device comprising:

a plurality of memory banks, wherein each of the memory banks includes a plurality of normal memory cells arranged in a plurality of normal columns, and redundancy cells arranged in one or more redundancy columns used for repairing normal columns containing defective normal memory cells, wherein a column of two or more memory banks is selected by a single column selection signal; and a redundancy circuit for controlling replacement of a column containing a defective normal memory cell with the redundancy column, wherein the redundancy circuit comprises a plurality of programmable decoders, each programmable decoder comprising a plurality of column fuses and bank fuses, a repair column selector configured to be programmed with a column address of a normal column containing a defective memory cell to be repaired by cutting or blowing the column fuses of non-defective columns, and a repair bank selector configured to be programmed with a bank address of a memory bank containing a defective memory cell to be repaired by cutting or blowing the bank fuses of non-defective memory banks, wherein each programmable decoder is further configured to generate an output signal that can be used to produce a redundancy selection signal to enable a corresponding redundancy column in response to a predetermined column address signal group and a predetermined bank signal group.

11. The semiconductor memory device of claim 10, wherein the redundancy circuit further comprises a logic selector configured to receive the output signal from one of the plurality of programmable decoders and to generate an output that can be used to produce the redundancy selection signal, wherein the redundancy selection signal is selectively configured to enable either a redundancy column corresponding to an area in which the redundancy circuit is located or a redundancy column located in another area in response to a predetermined control signal.

12. The semiconductor memory device of claim 11, wherein the redundancy circuit further comprises an OR circuit for ORing the output signals of the plurality of programmable decoders and an output of the logic selector to generate the redundancy selection signal.

13. The semiconductor memory device of claim 10, wherein each of the programmable decoders further comprises a logic unit for ORing the output signal of the repair column selector and the output signal of the repair bank selector to generate the output signal of the programmable decoder.

14. The semiconductor memory device of claim 13, wherein each of the programmable decoders further comprises a repair determiner having an enable fuse and a disable fuse for controlling enabling of the repair column selector and the repair bank selector.

15. A semiconductor memory device comprising:

a plurality of memory banks, wherein each of the memory banks includes a plurality of normal memory cells arranged in a plurality of normal columns, and redundancy cells arranged in one or more redundancy columns used for repairing normal columns containing defective normal memory cells, wherein a column of two or more memory banks is selected by a single column selection signal; and a redundancy circuit for controlling replacement of a column containing a defective normal memory cell with the redundancy column, wherein the redundancy circuit comprises a plurality of programmable decoders, each programmable decoder comprising a plurality of column fuses and bank fuses which are configured to be selectively cut or blown corresponding to a column address of the normal column containing the defective memory cell and the bank address of the memory bank containing the defective memory cell, wherein each programmable decoder is further configured to generate an output signal that can be used to produce a redundancy selection signal to enable a corresponding redundancy column in response to a predetermined column address signal group and a predetermined bank signal group; and a column pre-decoder configured to be enabled under the control of the redundancy selection signal to activate the column selection signal in response to the column address signal group.

16. The semiconductor memory device of claim 15, further comprising:

a column address decoder for decoding an external column address group and generating the column address signal group; and a bank signal generator for decoding an external row address group and generating the bank signal group.

17. A method of replacing defective cells in a semiconductor memory device with redundancy cells, comprising:

programming a redundancy circuit to correspond to a normal column containing a defective memory cell or cells;

programming the redundancy circuit to correspond to a memory bank or bank group comprising the defective memory cell or cells, wherein the redundancy circuit can be programmed to enable a single redundancy column to replace defective cells in memory banks or bank groups in multiple normal columns; and enabling the redundancy circuit by cutting or blowing an enable fuse in the redundancy circuit.

18. The method according to claim 17 wherein the redundancy circuit comprises a plurality of programmable decoders programmed corresponding to column and bank addresses of defective normal memory cells.

19. The method according to claim 18 wherein a column pre-decoder of the semiconductor memory device is disabled in response to a repair mode of any of the programmable decoders.

20. The method according to claim 17, further comprising selectively enabling a redundancy column in either an area containing the redundancy circuit or in another area.

* * * * *